US006045252A

United States Patent [19]
Pedersen

[11] Patent Number: 6,045,252
[45] Date of Patent: *Apr. 4, 2000

[54] METHODS FOR ALLOCATING CIRCUIT DESIGN PORTIONS AMONG PHYSICAL CIRCUIT PORTIONS

[75] Inventor: Bruce B. Pedersen, San Jose, Calif.

[73] Assignee: Altera Corporation, San Jose, Calif.

[*] Notice: This patent is subject to a terminal disclaimer.

[21] Appl. No.: 09/064,705

[22] Filed: Apr. 22, 1998

Related U.S. Application Data

[63] Continuation of application No. 08/603,222, Feb. 20, 1996, Pat. No. 5,787,009.

[51] Int. Cl.$^7$ ............................................. G06F 17/50
[52] U.S. Cl. ................................. 364/489; 364/490
[58] Field of Search .................... 364/488–491, 364/578

[56] References Cited

U.S. PATENT DOCUMENTS

| | | | |
|---|---|---|---|
| 3,617,714 | 11/1971 | Kernigham et al. | 235/150 |
| 4,495,559 | 1/1985 | Gelatt, Jr. et al. | 364/148 |
| 4,577,276 | 3/1986 | Dunlop et al. | 364/491 |
| 4,593,363 | 6/1986 | Burstein et al. | 364/191 |
| 4,609,986 | 9/1986 | Hartmann et al. | 364/200 |
| 4,617,479 | 10/1986 | Hartman et al. | 307/469 |
| 4,677,318 | 6/1987 | Veenstra | 307/465 |
| 4,713,792 | 12/1987 | Hartmann et al. | 364/900 |
| 4,774,421 | 9/1988 | Hartmann et al. | 307/465 |
| 4,871,930 | 10/1989 | Wong et al. | 307/465 |

(List continued on next page.)

OTHER PUBLICATIONS

Breuer, Melvin A., "A Class of Min–Cut Placement Algorithms", Dept. of Elec. Eng. & Comp. Sci., University of Southern California, pp. 284–290.

Fiduccia, C.M., et al., "A Linear–Time Heuristic for Improving Network Partitions", 19th Design Automation Conference, 1982, pp. 241–247.

Kernighan, B.W., et al., An Efficient Heuristic Procedure for Partitioning Graphs, *Bell Sys. Tech. Jour.*, pp. 291–307 (1970).

Krishnamurthy, Balakrishnan, "An Improved Min–Cut Algorithm For Partitioning VLSI Networks", *IEEE Transactions on Computers*, vol. C–33, No. 5, May 1984, pp. 438–446.

Schweikert, D.G., et al., "A Proper Model for the Partitioning of Electrical Circuits", Proceedings of the 9th Design Automation Workshop, 1979, pp. 57–62.

Chatterjee, A., et al., "A New Simultaneous Circuit Partitioning and Chip Placement Approach Based on Simulated Annealing", 27th ACM/IEEE Design Automation Conference, 1990, pp. 36–39.

Cheng, C., "The Optimal Circuit Decompositions Using Network Flow Formulations", IEEE International Symposium, 1990, pp. 2650–2653.

Tsay, R., et al., "A Unified Approach to Partitioning and Placement", *IEEE Transactions on Circuits and Systems*, vol. 38, No. 5, May 1991, pp. 521–533.

Saab, Y., et al., "On the Graph Bisection Problem", *IEEE Transactions on Circuits and Systems—Part 1: Fundamental Theory and Applications*, vol. 39, No. 9, Sep. 1992, pp. 760–762.

(List continued on next page.)

*Primary Examiner*—Kevin J. Teska
*Assistant Examiner*—Phallaka Kik
*Attorney, Agent, or Firm*—Fish & Neave; Douglas A. Cardwell

[57] ABSTRACT

Partitioning of a circuit design to facilitate economical implementation of that circuit in a physical circuit that is made up of two or more physical subcircuits is improved by starting with two different, conventionally produced partitions of the design and combining selected features of those two starting partitions to produce a final partition that is better than either of the starting partitions.

10 Claims, 13 Drawing Sheets

U.S. PATENT DOCUMENTS

| | | | |
|---|---|---|---|
| 4,899,067 | 2/1990 | So et al. | 307/465 |
| 4,908,772 | 3/1990 | Chi | 364/491 |
| 4,912,342 | 3/1990 | Wong et al. | 307/465 |
| 4,918,614 | 4/1990 | Modarres et al. | 364/490 |
| 5,113,352 | 5/1992 | Finnerty | 364/490 |
| 5,121,006 | 6/1992 | Pedersen | 307/465 |
| 5,187,784 | 2/1993 | Rowson | 395/500 |
| 5,218,551 | 6/1993 | Agrawal et al. | 364/491 |
| 5,220,214 | 6/1993 | Pedersen | 307/465 |
| 5,224,056 | 6/1993 | Chene et al. | 364/490 |
| 5,237,514 | 8/1993 | Curtin et al. | 364/490 |
| 5,251,147 | 10/1993 | Finnerty | 364/490 |
| 5,260,610 | 11/1993 | Pedersen et al. | 307/465 |
| 5,260,611 | 11/1993 | Cliff et al. | 307/465 |
| 5,308,798 | 5/1994 | Brasen et al. | 437/250 |
| 5,341,308 | 8/1994 | Mendel | 364/489 |
| 5,349,536 | 9/1994 | Ashtaputre et al. | 364/491 |
| 5,350,954 | 9/1994 | Patel | 307/465 |
| 5,359,537 | 10/1994 | Saucier et al. | 364/489 |
| 5,359,538 | 10/1994 | Hui et al. | 364/491 |
| 5,371,422 | 12/1994 | Patel et al. | 326/41 |
| 5,398,195 | 3/1995 | Kim | 364/491 |
| 5,436,849 | 7/1995 | Drumm | 364/490 |
| 5,495,419 | 2/1996 | Rostoker et al. | 364/468 |
| 5,506,788 | 4/1996 | Cheng et al. | 364/491 |
| 5,513,124 | 4/1996 | Trimberger et al. | 364/491 |
| 5,521,837 | 5/1996 | Frankle et al. | 364/491 |
| 5,557,533 | 9/1996 | Koford et al. | 364/491 |
| 5,568,636 | 10/1996 | Koford | 395/500 |
| 5,636,125 | 6/1997 | Rostoker et al. | 364/468.28 |
| 5,659,717 | 8/1997 | Tse et al. | 395/500 |
| 5,682,321 | 10/1997 | Ding et al. | 364/490 |
| 5,699,265 | 12/1997 | Scepanovic et al. | 364/491 |
| 5,757,657 | 5/1998 | Hathaway et al. | 364/491 |

OTHER PUBLICATIONS

Dahmani, A., et al., "ML–Germinal: A New Heuristic Standard Cell Placement Algorithm", IEEE European Design Automation Conference, 1993, pp. 184–188.

Mortazavi, M., et al., "A Generic Floorplanning Methodology", IEEE Autotestcon, Sep. 1994, pp. 749–736.

Takahashi, K. Et al., "Min–Cut Placement with Global Objective Functions for Large Scale Sea–of–Gates Arrays", *IEEE Transactions on Computer–Aided Design of Integrated Circuits and Systems,* vol. 14, No. 4, Apr. 1995, pp. 434–446.

Yeh, C., et al., "On the Integration of Partitioning and Global Routing for Rectilinear Placement Problems", *IEEE Transactions on Computer–Aided Design of Integrated Circuits and Systems,* vol. 15, No. 1, Jan. 1996, pp. 83–91.

Vijayan, G., "Partitioning Logic on Graph Structures to Minimize Routing Cost," *IEEE Transactions On Computer–Aided Design,* vol. 9, No. 12, Dec. 1990, pp. 1326–1334.

Chrzanowska–Jeske, M. et al., "Partitioning Approach to Find an Exact Solution to the Fitting Problem in an Application–Specific EPLD Device," European Design Automation Conference Proceedings, Sep. 1993, pp. 39–44.

P5 / P6

METHODS FOR ALLOCATING CIRCUIT DESIGN PORTIONS AMONG PHYSICAL CIRCUIT PORTIONS

This is a continuation of application Ser. No. 08/603,222, filed Feb. 20, 1996, now issued as U.S. Pat. No. 5,787,009 which is incorporated by reference herein.

BACKGROUND OF THE INVENTION

This invention relates to electronic circuit design and implementation, and more particularly to partitioning an electronic circuit design into subcircuits such that the requirements for connections between the subcircuits are reduced.

Although this invention is applicable in many other contexts, the significance of the invention will be fully appreciated from the following discussion, which is primarily directed to application of the invention to sub-dividing a user's logic design into subcircuits that can be implemented in respective regions of programmable logic in a programmable logic array integrated circuit device, the subcircuits being selected to hold down the number of connections that must be made between the logic regions. Examples of other possible uses of the invention are partitioning any type of circuitry among two or more components such as printed circuit boards or integrated circuits.

Programmable logic array integrated circuit devices typically have a large number of regions of programmable logic. An example of such a device is shown in commonly assigned Cliff et al. U.S. Pat. No. 5,689,195, which is hereby incorporated by reference herein. Each logic region is programmable to perform any of a plurality of logic functions on a plurality of input signals applied to the region to produce one or more output signals of the region. A programmable network of interconnection conductors is also provided on the device. This network is programmable to connect each logic region output to substantially any logic region input so that much more complicated logic functions can be performed by concatenating the functions of the individual logic regions. The interconnection conductor network is also used to bring external signals into the logic of the device and to convey signals generated by the device out for external use.

An objective in the design of programmable logic array integrated circuit devices is to provide enough interconnection circuitry so that needed interconnections can be made for the largest possible number of users' logic designs, without providing excessive amounts of such resources that take up space and will be largely unused in many cases. Programmable logic array integrated circuits are therefore typically designed with substantially less interconnection circuitry than would be required for completely universal, simultaneous connectability of any logic region output to any logic region input.

A technology which can be employed to help hold down the need to use interconnection resources in programmable logic array devices is circuit partitioning. In this application of circuit partitioning the objective is to partition the user's logic design into a number of logic design subcircuits, each of which will fit in a logic region, these subcircuits being additionally selected to hold down the required number of connections between subcircuits. Efficient partitioning of this kind may make it possible to implement in a programmable logic array device a user's logic design that otherwise would not be implementable in that device because of premature exhaustion of the interconnection resources of the device. Another advantage of the availability of efficient partitioning is that it may make it possible to design programmable logic array devices with an even smaller percentage of the overall resources of the device devoted to interconnections, without adversely affecting usability of the device, and possibly even increasing usability by allowing more logic regions to be added in the area that otherwise would be devoted to interconnection resources.

Even if partitioning is being performed for purposes other than fitting a user's logic design into a programmable logic array device, holding down the number of connections between the subcircuits into which a circuit must be partitioned is frequently an important objective of the partitioning. For example, if a circuit design is being partitioned so that it can be divided among two or more circuit boards or integrated circuits, it is generally desirable to reduce the number of connections that will be needed between the circuit boards or integrated circuits. In the case of integrated circuits, for example, there may simply not be enough input/output pin space available on an integrated circuit unless efforts are made to reduce the required number of connections to and from the device.

Many circuit partitioning techniques are known (see, for example, the techniques discussed in Mendel U.S. Pat. No. 5,341,308 and in Tse et al. U.S. Pat. No. 5,659,717, both of which are hereby incorporated by reference herein). Most partitioning techniques work by examining several possible partitions, and selecting the best of those solutions. Even the best solution selected by such a technique may be far from the truly optimal solution, but the computational expense of continuing the search for better solutions through vast numbers of possible solutions may be too great to warrant continuing the searching process. The above-described benefits of finding better partitions are considerable, however, and so there is a need for improved circuit partitioning techniques, especially those that avoid continued "brute force" searching through myriad possible solutions.

In view of the foregoing, it is an object of this invention to provide improved circuit partitioning techniques.

It is a more particular object of this invention to provide circuit partitioning techniques that improve upon the results of trial partitioning without continuing to simply search for more trial partitions in the same way that the initial trial partitions were found.

SUMMARY OF THE INVENTION

These and other objects of the invention are accomplished in accordance with the principles of the invention by starting with two trial partitions of a circuit design which includes a plurality of circuit elements and a plurality of connections between those elements. Each of the trial partitions is produced in a conventional way and divides the circuit design into respective, different, first and second pluralities of design subcircuits. Each design subcircuit is implementable in a respective one of a plurality of physical subcircuits that collectively comprise the physical circuit in which it is desired to implement the circuit design. Preferably, the two trial partitions are the best of several trial partitions that have been found using a conventional partitioning technique. The methods of this invention combine these two trial partitions in such a way that the resulting "final" partition is better than either of the trial partitions.

In each of the design subcircuits each connected component is identified, a connected component being any subplurality of the circuit elements which are within the design subcircuit and which are all connected to one another by one or more connections which extend only to elements in the subplurality and which are therefore also part of the connected component.

For each connected component in each of the first and second pluralities of design subcircuits, the following steps are performed. All connected components in the other of the first and second pluralities that have at least one element in common with the connected component are identified as adjacent connected components. The number of connections which are part of the connected component is determined and identified as a first number. The number of connections which are part of the adjacent connected components and which are also connected to at least one element of the connected component is determined and identified as a second number, the connections in the second number being referred to as adjacent connections. The first and second numbers are compared to determine which is predominant. ("Predominant" as used herein means that one number is larger than the other, but in some cases a number may be said to be "predominant" if it is equal to another number.) If the first number is predominant, then the adjacent connections are deleted from the adjacent connected components, with consequent modification of the elements and connections which are part of the adjacent connected components.

After the preceding steps have been performed (preferably repeatedly and until no more adjacent connections are being deleted), the connected components that remain in the first and second pluralities of design subcircuits are combined to produce a plurality of combined connected components. These combined connected components and any elements that are not part of any combined connected component are included together in modified design subcircuits to the extent that each modified design subcircuit can be implemented in a respective one of the physical subcircuits. In general, the modified design subcircuits will constitute a better partition of the circuit design than either of the two trial partitions that the process starts from. Each modified design subcircuit is implemented in the respective one of the physical subcircuits.

The step of including combined connected components and other elements in the modified design subcircuits can include the following steps performed for each combined connected component. The connected components that remain in the first plurality of design subcircuits and that have at least one element in common with the combined connected component are determined and identified as first related connected components. The number of connections that are part of any of the first related connected components and connect to but are not part of the combined connected component is determined and identified as a third number. The connected components that remain in the second plurality of design subcircuits and that have at least one element in common with the combined connected component are determined and identified as second related components. The number of connections that are part of any of the second related connected components and connect to but are not part of the combined connected component is determined and identified as a fourth number. The third and fourth numbers are then compared. If the third number predominates, then the connections that account for the fourth number are deleted from the connected components that remain in the second plurality, with consequent modification of the elements and connections which are part of the second related connected components. On the other hand, if the fourth number predominates, then the connections that account for the third number are deleted from the connected components that remain in the first plurality, with consequent modification of the elements and connections which are part of the first related connected components. Then the connected components that remain in the first and second pluralities of design subcircuits after performance of the preceding steps are combined to produce a plurality of modified combined connected components which take the place of the combined connected components in subsequently performed steps. Performance of the steps summarized in this paragraph may further improve the modified design subcircuits as a partition of the circuit design.

The step of including combined connected components and other elements in the modified design subcircuits may further include the following step for each combined connected component. For each connection that is not part of the combined connected component but that is connected to that combined connected component, it is determined whether that combined connected component together with that connection and all other combined connected components and circuit elements to which that connection connects can be implemented in a respective one of the physical subcircuits. If so, then that combined connected component is modified to include that connection and the other combined connected components and circuit elements to which that connection connects. Performance of the step summarized in this paragraph may still further improve the modified design subcircuits as a partition of the circuit design.

The step of including combined connected components and other elements in the modified design subcircuits may further include bin-packing the combined connected components and any circuit elements that are not part of any combined connected component into the modified design subcircuits. Conventional bin-packing techniques may be used for this step. Performance of this step may still further improve the modified design subcircuit as a partition of the circuit design.

Further features of the invention, its nature and various advantages will be more apparent from the accompanying drawings and the following detailed description of the preferred embodiments.

DETAILED DESCRIPTION OF THE PREFERRED EMBODIMENTS

For convenience and generality herein, a circuit design to be partitioned will be represented graphically by a so-called hypergraph in which each vertex represents a circuit element and each edge represents a circuit connection between the circuit elements to which that edge extends. The following detailed description of the preferred embodiments is given in terms of manipulating the vertices and edges of such a hypergraph. It will be understood, however, that these terms are merely convenient alternatives to more conventional circuit design terminology, and that the circuit information represented herein by a hypergraph can be represented and manipulated in any other form in accordance with this invention.

Figure 1:
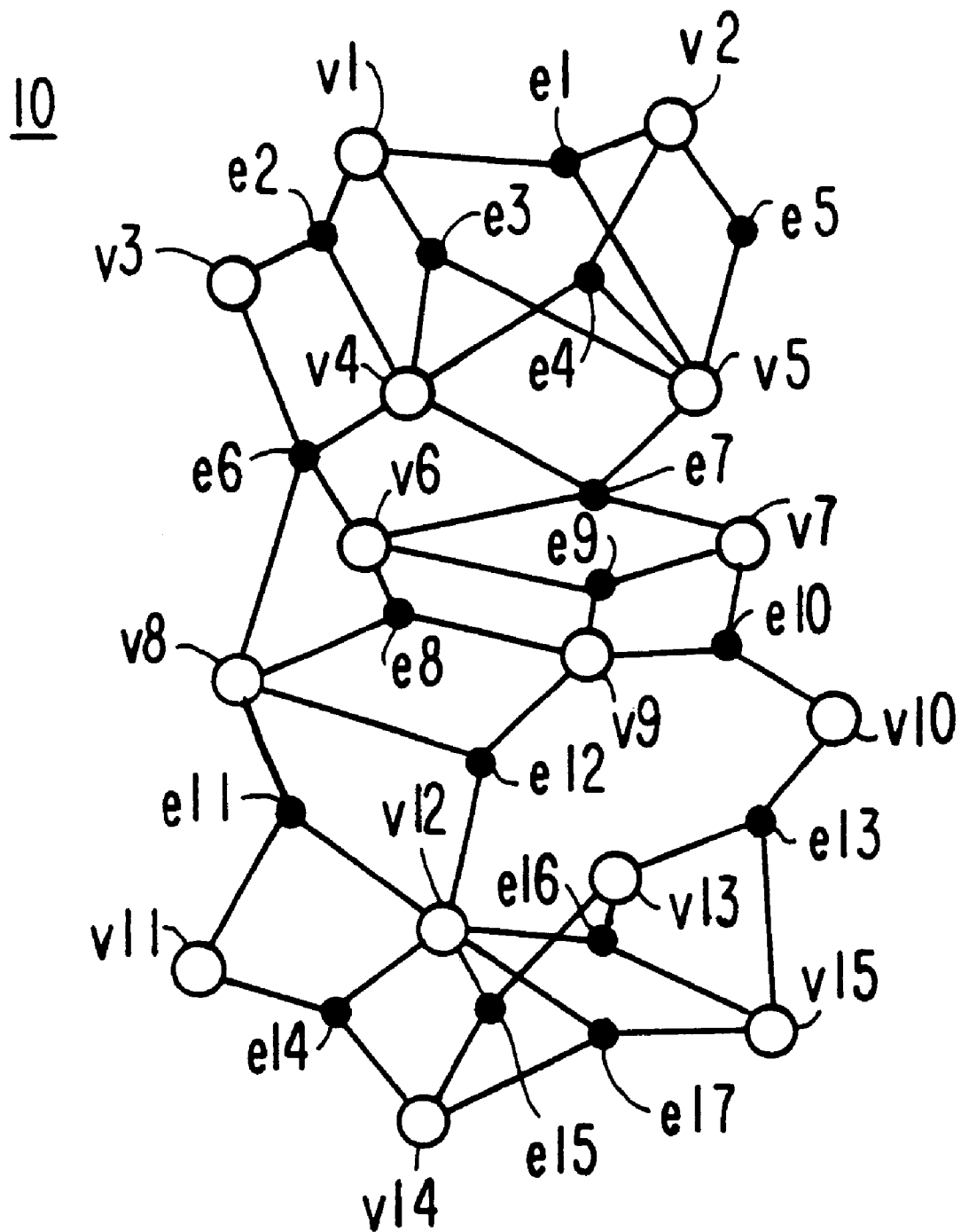
FIG. 1 is a graphic representation of an illustrative circuit design requiring partitioning.
Figure 2A:
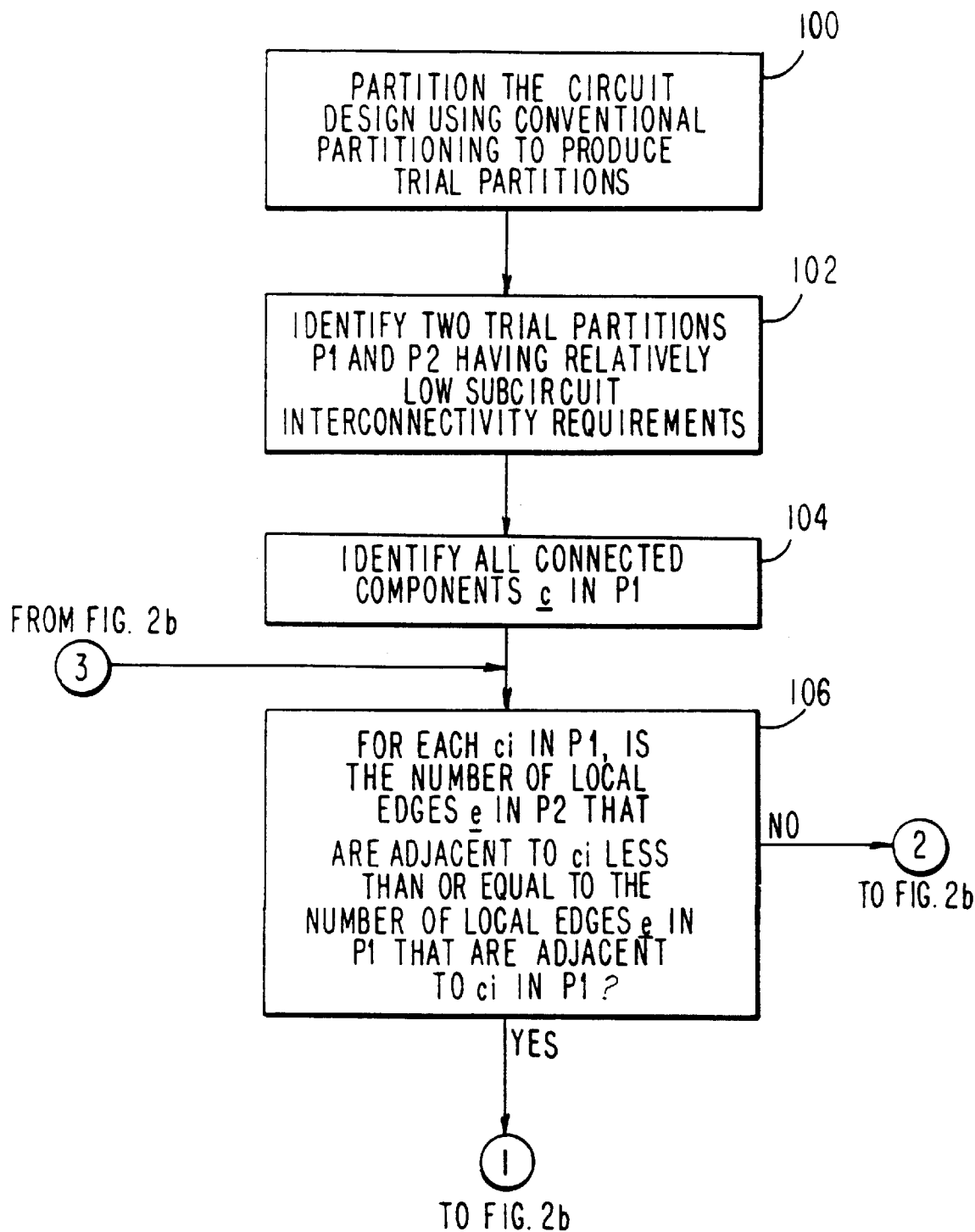
FIGS. 2a–2f (sometimes referred to collectively as FIG. 2) are a flow chart of an illustrative embodiment of the methods of this invention for improving partitioning of a circuit design.
Figure 2B:
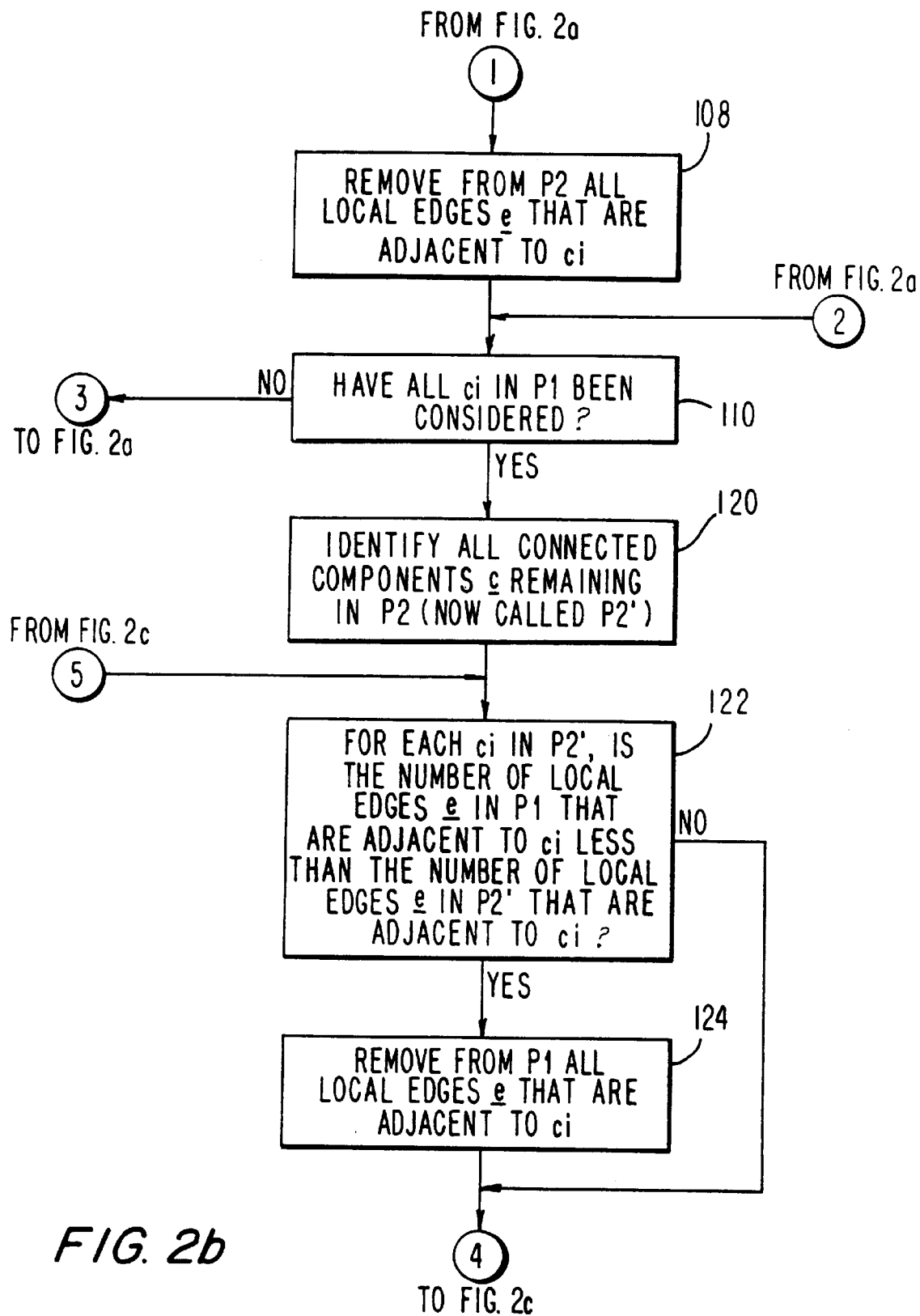
Figure 2C:
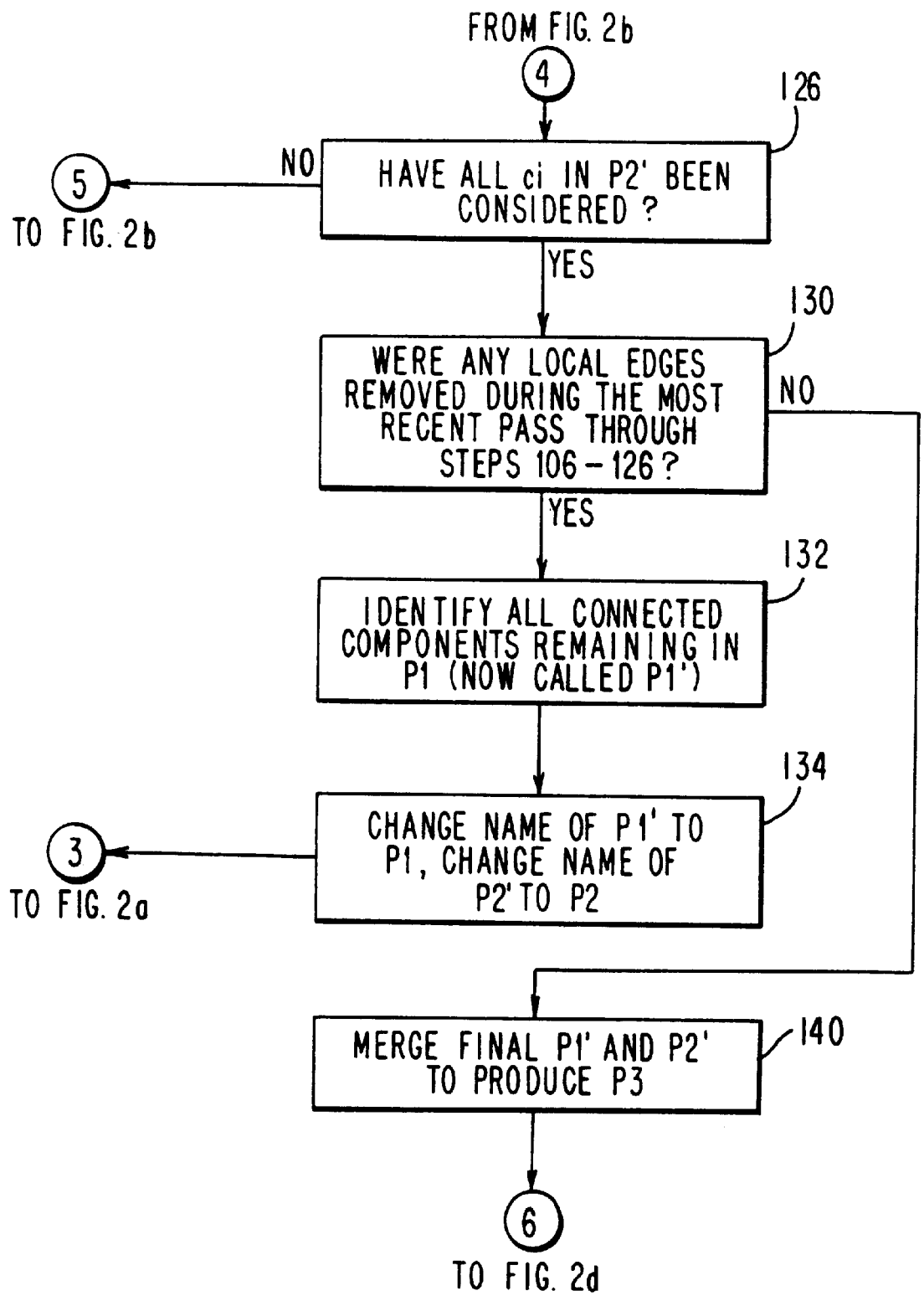
Figure 2D:
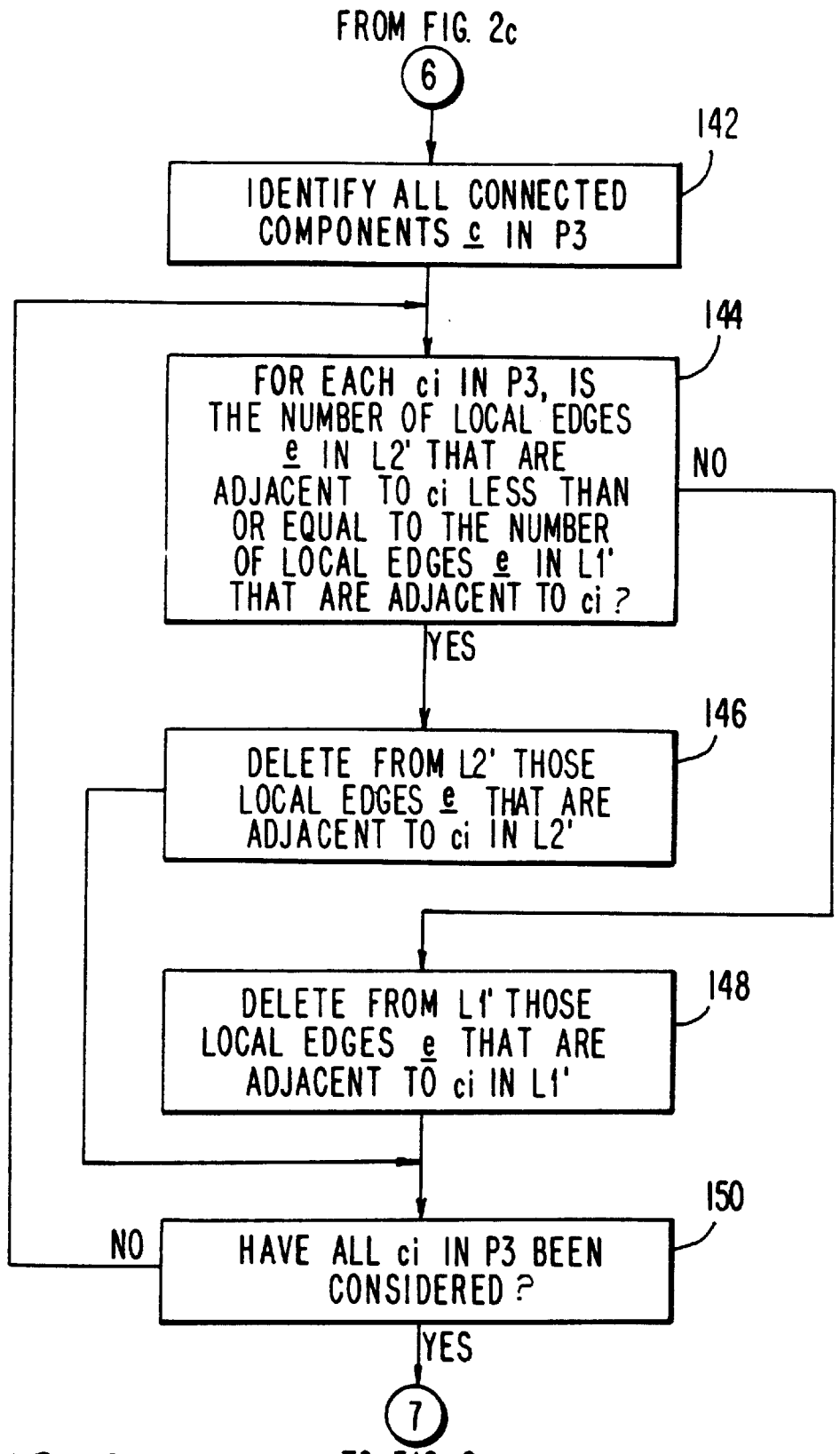
Figure 2E:
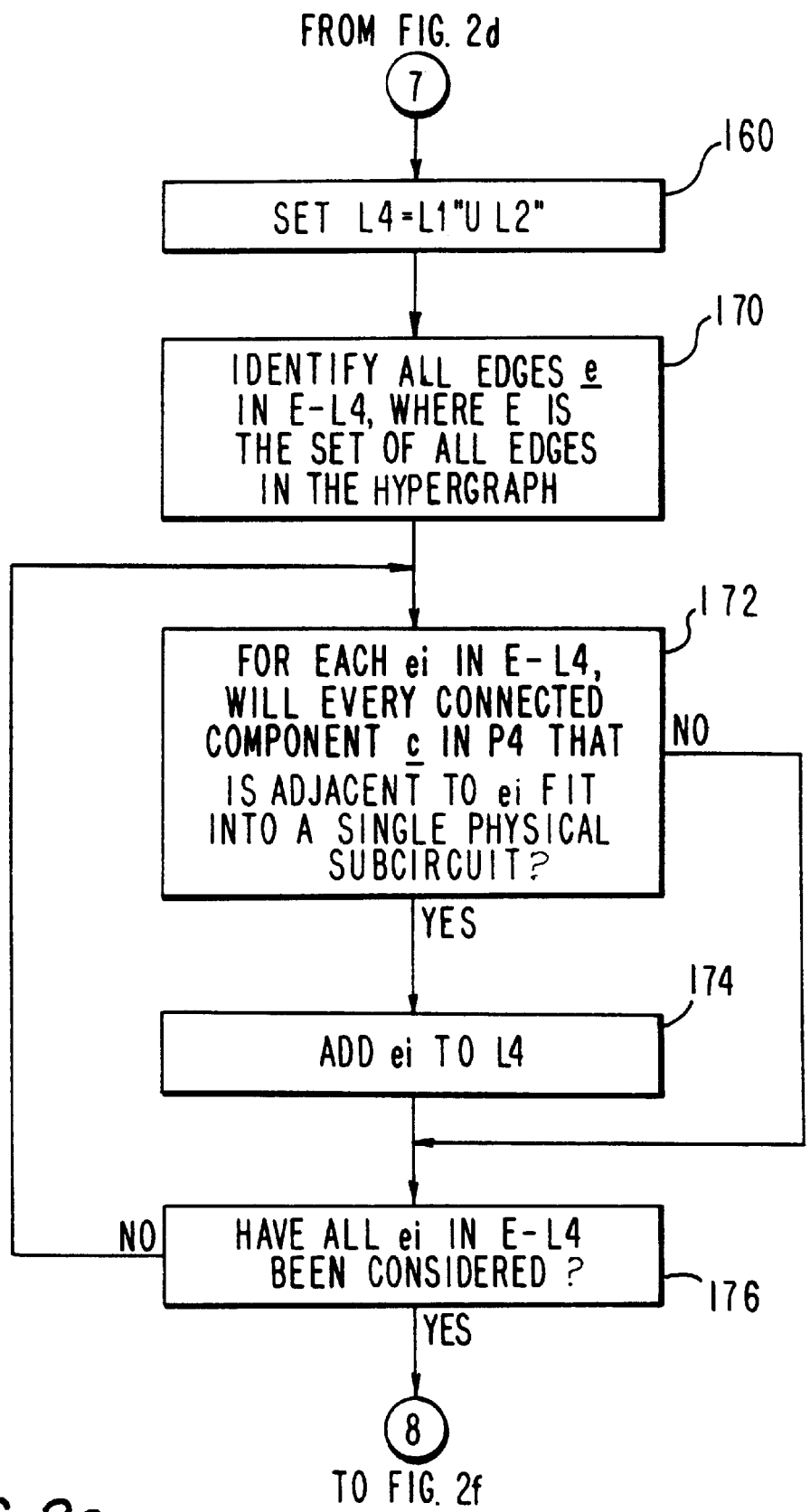
Figure 2F:
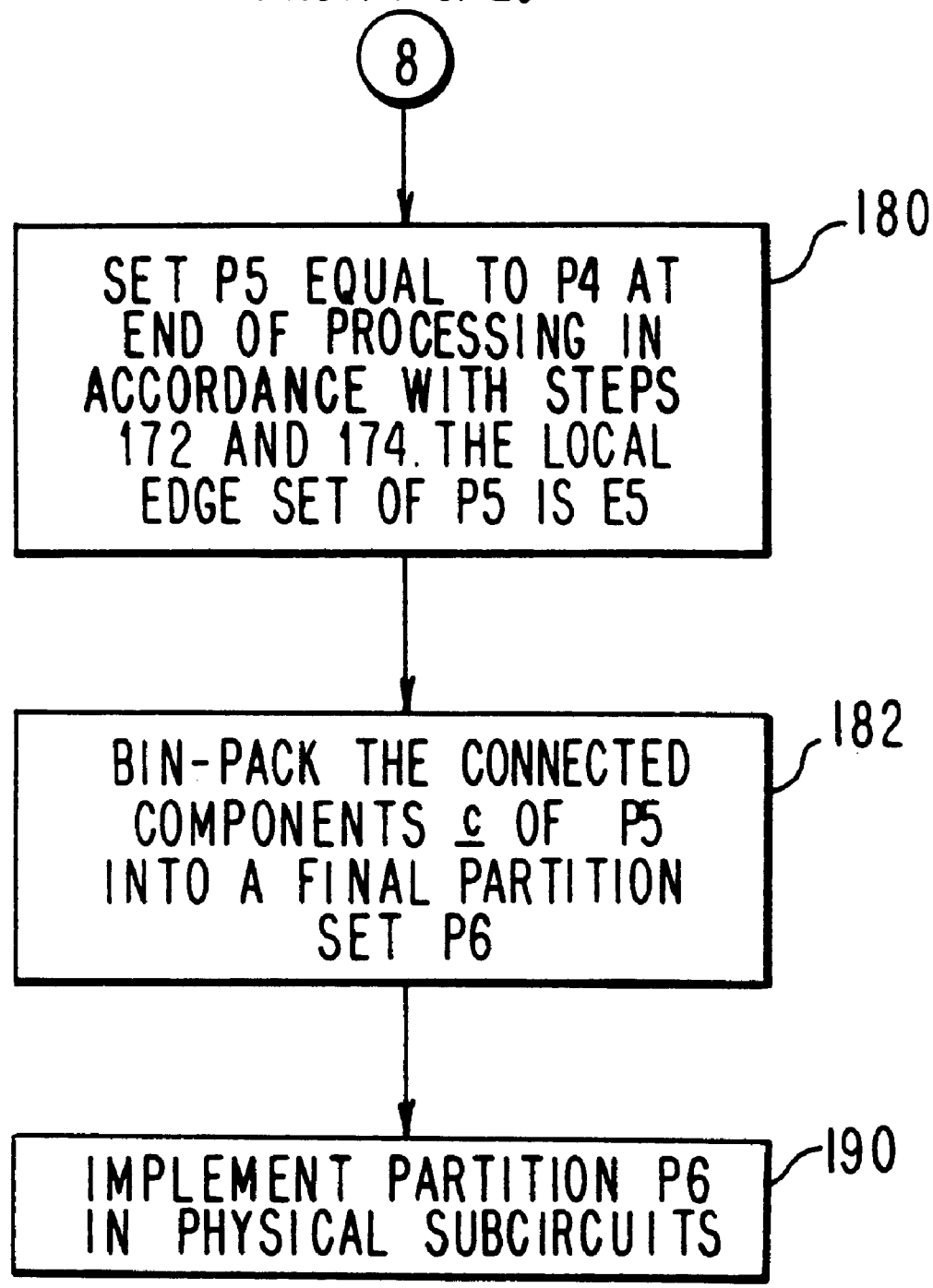

As shown in FIG. 1, an illustrative circuit design to be partitioned is represented by hypergraph 10. In hypergraph 10 each vertex v1–v15 represents a circuit element such as a module of logic (e.g., a logic gate, a logic region in a programmable logic array device, or any other convenient unit of circuitry). Each edge e1–e17 represents a net of connections between the vertices to which that edge extends. Edge e1, for example, represents a connection between vertices v1, v2, and v5. Edge e5 represents another connection between vertices v2 and v5. A hypergraph differs from an ordinary graph in that an edge in a hypergraph can connect more than two vertices. It does not matter for present purposes whether each connection to a vertex is an input or an output of the circuit element represented by that vertex.

The object of partitioning the circuit design represented by hypergraph 10 is to break that design down into subcircuits, each of which will fit into a predetermined physical subcircuit resource, while at the same time making reasonably full use of that resource. In the case of partitioning a user's logic design for implementation in a programmable logic array device, for example, the object of the partitioning may be to break the user's logic design down into modules that will fit into respective logic regions of the device, with each module making reasonably full use of the resources of its logic region and with economy in the need for interconnections between the logic regions.

As a preliminary to the method of this invention, any suitable conventional partitioning technique may be used to partition hypergraph 10 to produce trial partitions that satisfy the objectives of the partitioning to the extent that it is reasonably practical for that conventional partitioning technique to achieve. This step is shown at 100 in FIG. 2. Each acceptable trial partition should satisfy the requirement that each design subcircuit in that partition fits in the physical circuit resource available for that design subcircuit.

Figure 3:
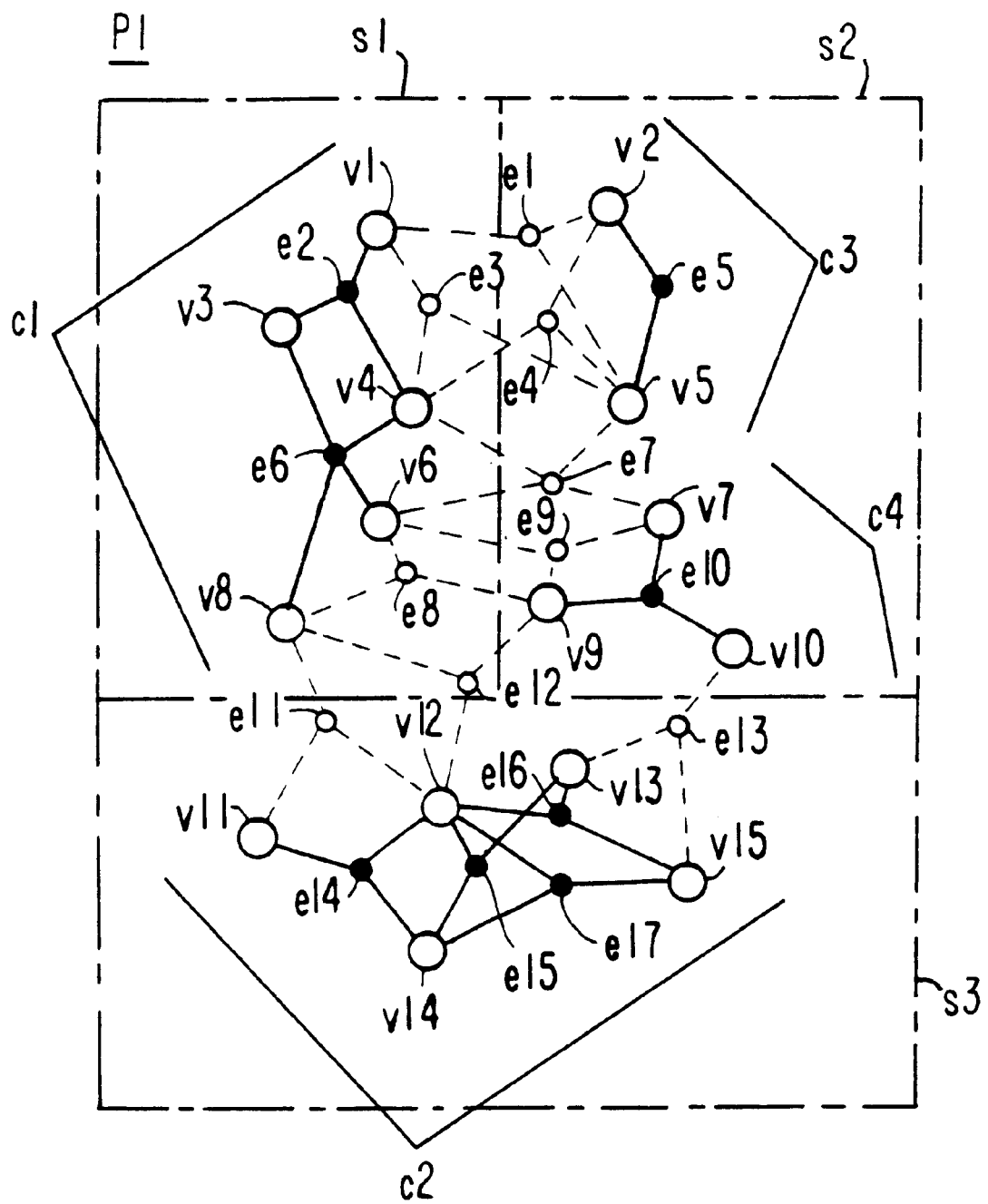
FIGS. 3–8 are each similar to FIG. 1, but show successive stages in the partitioning of the circuit design represented by FIG. 1 in accordance with this invention.

When a reasonable expenditure of effort has been made in step 100, step 102 is performed to select from among the step 100 trial partitions two partitions that are relatively economical with respect to total requirements for connections between the design subcircuits of each partition. For example, FIGS. 3 and 4 may represent two trial partitions of hypergraph 10 that have been produced by step 100 and selected by step 102. In partition P1 (FIG. 3) hypergraph 10 has been partitioned into design subcircuits s1, s2, and s3. Design subcircuit s1, for example, includes vertices v1, v3, v4, v6, and v8 and the edges that extend solely among these vertices (i.e., edges e2 and e6 shown in solid lines in FIG. 3). Edges that extend beyond design subcircuit sl are shown in dotted lines. For example, edge e1 touches both design subcircuit s1 and design subcircuit s2. Edge e12 touches all three design subcircuits s1, s2, and s3. To take another example, in partition P2 (FIG. 4) hypergraph 10 has been partitioned into design subcircuits s4, s5, and s6. Design subcircuit s5 includes vertices v6, v8, v11, v12, and v14 and edges that extend solely among these vertices (i.e., edges e11 and e14 shown in solid lines in FIG. 4). Edges that extend between design subcircuits (e.g., edges e6 and e7) are shown in dotted lines.

In partitions such as P1 and P2 edges that touch only vertices within a single design subcircuit are called "local" edges. These are the edges shown in solid lines in FIGS. 3 and 4. All other edges are called "global" edges and are shown in dotted lines in FIGS. 3 and 4. The local edge set for partition P1 is L1={e2, e5, e6, e10, e14, e15, e16, e17}. The local edge set for partition P2 is L2={e1, e2, e3, e4, e5, e10, e11, e13, e14}. An objective of this invention is to find a final partition with a maximized or at least relatively maximized local edge set. This final partition will have a minimized or at least relatively minimized global edge set, which corresponds to a requirement for relatively few connections between the physical subcircuits that are used to implement the design subcircuits of the final partition.

A "connected component" in each partition of hypergraph 10 is a maximal set of vertices such that every vertex in the connected component has a local edge connection to every other vertex in that connected component. For example, design subcircuit s1 in partition P1 includes connected component c1, design subcircuit s2 includes connected components c3 and c4, and design subcircuit s3 includes connected component c2. In partition P2 design subcircuits s4, s5, and s6 include connected components c5, c6, and c7, respectively. As shown in FIG. 2, the next step 104 in the method of this invention is to identify all connected components in one of the two partitions (e.g., P1) selected in step 102.

The next step 106 in the method of this invention is to consider each connected component $c_i$ in partition P1 in turn to determine whether that connected component has a number of local edges e in L2 that is less than or equal to the number of local edges e in L1 that are adjacent to that connected component.

For each $c_i$ in partition P1 that the test of step 106 is satisfied, step 108 is performed to remove from partition P2 the local edges e that are adjacent to that $c_i$. For example, performance of step 106 for connected component c2 reveals that there are two local edges e11 and e13 in partition P2 that are adjacent to c2. This is fewer than the number of local edges (e14, e15, e16, and e17) that are adjacent to c2 in partition P1. Accordingly, step 108 is performed to "remove" local edges e11 and e13 from P2. (To "remove" a local edge means to convert it from a local edge to a global edge.) When connected component cl is considered in step 106, local edges e1, e3, and e4 are not removed from partition P2 (i.e., step 108 is bypassed for c1) because they outnumber the local edges e2 and e6 that are adjacent to c1 in partition P1. (Indeed, if c1 were considered before c2, e11 would also not be removed as part of the consideration of c1, but it would be removed (as described above) during the subsequent consideration of c2.) Step 110 returns control to step 106 until all connected components $c_i$ in P1 have been considered. Thereafter, control passes from step 110 to step 120.

Figure 5:
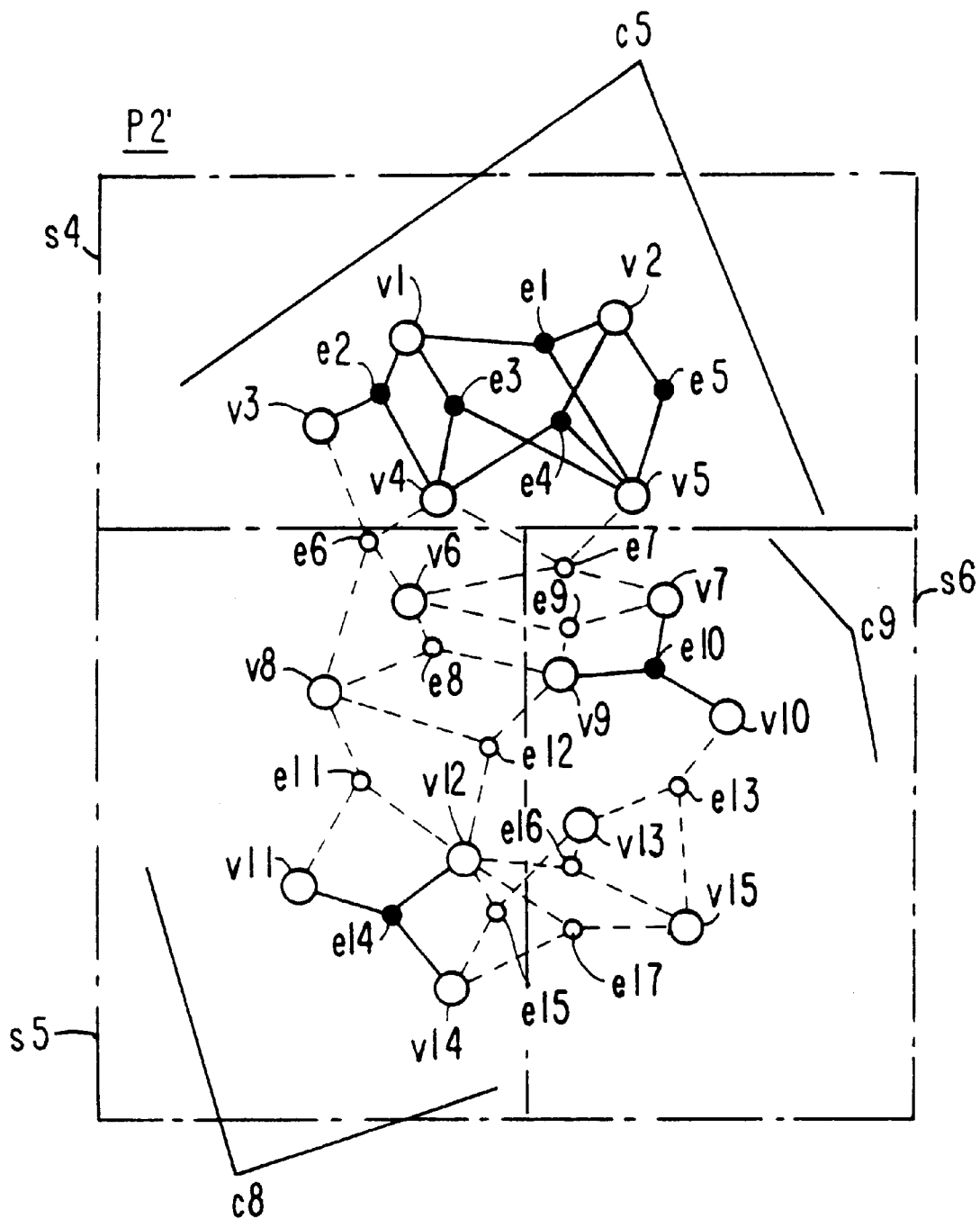

In step 120 all connected components remaining in P2 are identified. It should be noted that the removal of local edges e11 and e13 as described above alters the connected components of P2 to those shown in FIG. 5 (i.e., c5, c8, and c9). Step 120 is therefore similar to step 104 but for the modified version P2' of partition P2 shown in FIG. 5.

Figure 6:
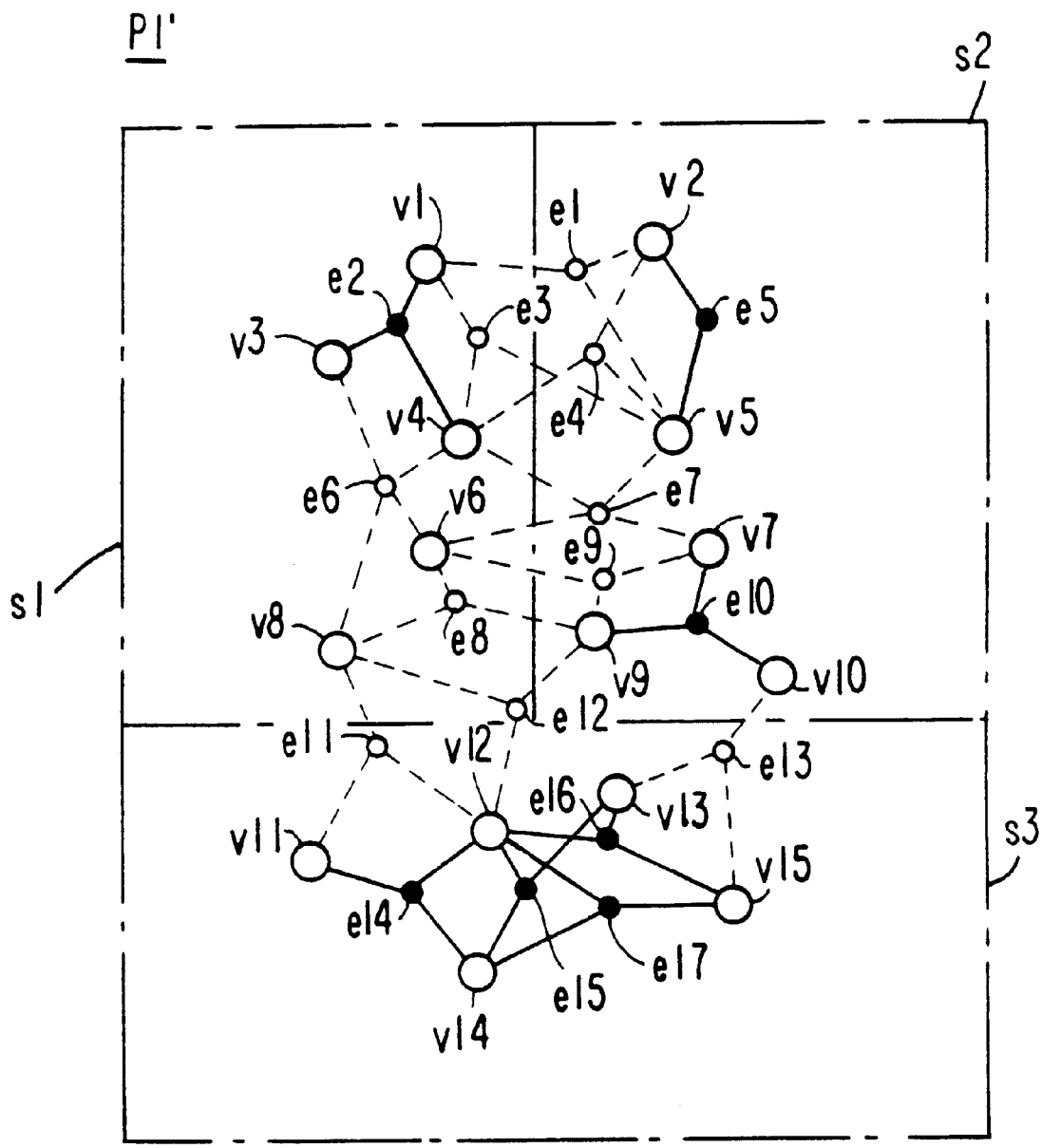

In step 122 each connected component $c_i$ in P2' is considered in turn. If the number of local edges in P1 that are adjacent to a connected component $c_i$ from P2' is less than the number of local edges in P2' that are adjacent to that connected component, then step 124 is performed to remove from P1 the local edges that are adjacent to that connected component. (Again, to "remove" a local edge from P1 means to convert that edge to a global edge.) If the test of step 122 is not satisfied for a particular $c_i$, then step 124 is bypassed for that $c_i$. Steps 122 and 124 are therefore generally similar to steps 106 and 108. Step 126 is performed to return control to step 122 until all $c_i$ in P2' have been considered. Thereafter control passes from step 126 to step 130. In the example shown in the drawings, performance of steps 122 for c5 reveals only one local edge e6 in P1 which is adjacent to c5. Because this is less than the number of local edges in P2' that are adjacent to c5, step 124 is performed for c5 to remove e6 from P1. Neither of the other connected components c8 and c9 in P2' have fewer adjacent local edges in P1 than they have in P2', and so no other local edges are removed from P1. When control passes from step 126 to step 130 P1 will appear as shown in FIG. 6, where it is referred to as P1'.

Steps 130, 132, and 134 are performed to cause steps 106–126 to be repeated as long as the performance of steps 106–126 continues to result in removal of local edges e from either of partitions P1 and P2. Step 130 determines whether any local edges were removed during the last pass through steps 106–126. If so, control passes to step 132. If not, control passes to step 140. Step 132 is similar to step 120, but (in the particular example being discussed) identifies the connected components remaining in partition P1' as shown in FIG. 6. Step 134 is just a bookkeeping step which changes the names of P1' and P2' back to P1 and P2 in preparation for a repetition of steps 106–126. After step 134 control returns to step 106.

In the particular example being discussed, the second performance of steps 106–126 does not result in any more local edges being removed from either partition P1 or partition P2. Accordingly, the second performance of step 130 transfers control to step 140.

Figure 7:
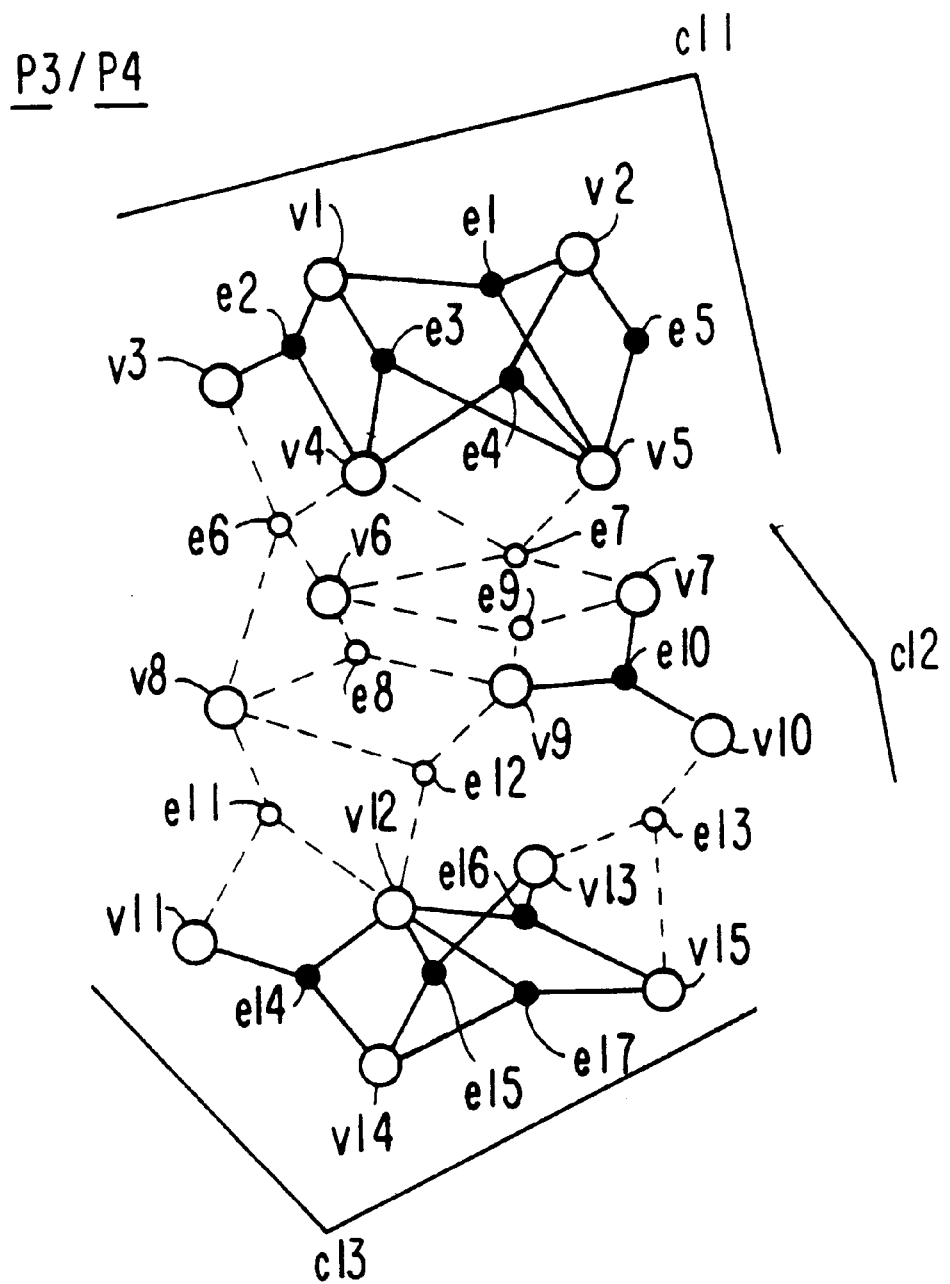

In step 140 the union of the sets L1' and L2' of local edges e in P1' and P2' is formed as shown, for example, in FIG. 7. This begins to produce a new partition P3.

In step 142 all connected components c in P3 are identified. Step 142 is therefore similar to step 104.

In step 144 each connected component ci in P3 is considered in turn. In particular, for each ci in P3 the number of local edges in L2' (the local edge set for P2') that are adjacent to that ci is compared to the number of local edges in L1' (the local edge set for P1') that are adjacent to that ci. If the number from L2' is less than or equal to the number from L1', then in step 146 those local edges are deleted from L2'. On the other hand, if the number from L1' is less than the number from L2', then in step 148 those local edges are deleted from L1'. (To "delete" a local edge means to convert it to a global edge.) In the particular example shown in the drawings L1' is {e2, e5, e10, e14, e15, e16, e17} and L2' is {e1, e2, e3, e4, e5, e10, e14}. Considering connected component c11 in FIG. 7, there are two local edges e2 and e5 adjacent to that component in L1' and five local edges e1, e2, e3, e4, and e5 adjacent to that component in L2'. Accordingly, steps 144 and 148 result in the deletion of e2 and e5 from L1'. Consideration of connected component c12 in FIG. 7 leads to deletion (via steps 144 and 146) of edge e10 from L2'. Consideration of connected component c13 in FIG. 7 leads to deletion (via steps 144 and 146) of edge e14 from L2'. Thus when steps 144–148 have been performed for all ci in P3 and control accordingly passes from step 150 to step 160, L1' and L2' have been respectively reduced to L1"={e10, e14, e15, e16, e17} and L2"={e1, e2, e3, e4, e5}.

In step 160 a new local edge set L4 is formed from the union of local edge sets L1" and L2". In the particular example shown in the drawings FIG. 7 also happens to show L4. In other words, it is coincidental in this example that each local edge weeded out of L1' to produce L1" was duplicated in L2' and vice versa. Thus when the union of L1" and L2" is formed in step 160, all of the weeded out local edges still appear in L4. FIG. 7 is therefore also labeled with the partition designation P4, which is the partition associated with L4.

At this stage the partition (P4) should already be better than either of the starting partitions P1 and P2. Thus it will be seen from FIG. 7 that there are more local edges in P4 than in either P1 or P2. In addition, further improvement may result from performing steps 170 et seq.

In step 170 all edges e in E–L4 are identified. These are the global edges in P4.

Figure 8:
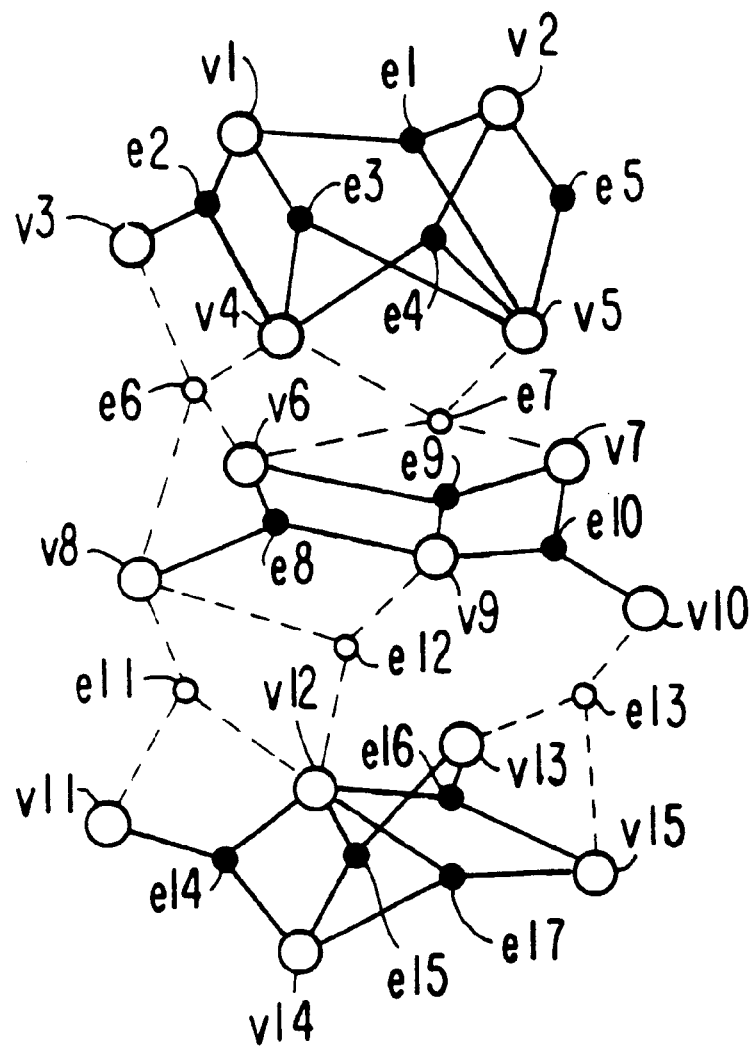

In step 172 each global edge ei in P4 is considered in turn. If all of the connected components c in P4 that are adjacent to edge ei will fit into a single physical subcircuit, then step 174 is performed to add ei to L4. (In this case vertices with no local edge connections are also considered connected components c.) Otherwise step 174 is bypassed for that ei. In the particular example shown in the drawings, connected components c11 and c13 in P4 are already relatively large and are therefore assumed to require substantially all of the resources of respective physical subcircuits. Thus no more components can be added to c11 or c13. Connected component c12, however, is relatively small. Thus performance of steps 172 and 174 results in the addition of vertices v6 and v8 to connected component c12 (via addition of edges e8 and e9 to L4). The resulting new partition P5 is shown in FIG. 8. The local edge set of partition P5 is designated L5.

When steps 172 and 174 have been performed for all ei in E–L4, control passes from step 176 to step 180. Step 180 is merely a bookkeeping step to update the designations of the partition and its local edge set.

Step 182 is now performed to aggregate connected components c (which again may include individual vertices) into a final set of design subcircuits, each of which will fit into and make reasonably full use of a respective one of the available physical subcircuits. This may be done using a conventional "bin-packing" routine. For example, performance of step 182 may reveal that a particular connected component c in P5 uses only a relatively small portion of the capabilities of a physical subcircuit. Step 182 will therefore add one or more other connected components c to the first connected component until the resources of the physical subcircuit are more fully utilized. At this point, even components c that have no edges e in common may be combined for implementation in a given physical subcircuit. The set of final design subcircuits that results from performing step 182 is designated partition P6. This is the final partition of the design circuit, and it is used to allocate the various design circuit elements represented by hypergraph 10 among the available physical subcircuits as shown in step 190. In the particular example shown in the drawings, P5 already has the correct number of correctly sized connected components c for the available physical subcircuits. Thus in this example no further bin-packing in accordance with step 182 is necessary. FIG. 8 is therefore labeled both P5 and P6 to indicate that this FIG. shows the final partition of hypergraph 10.

Figure 4:
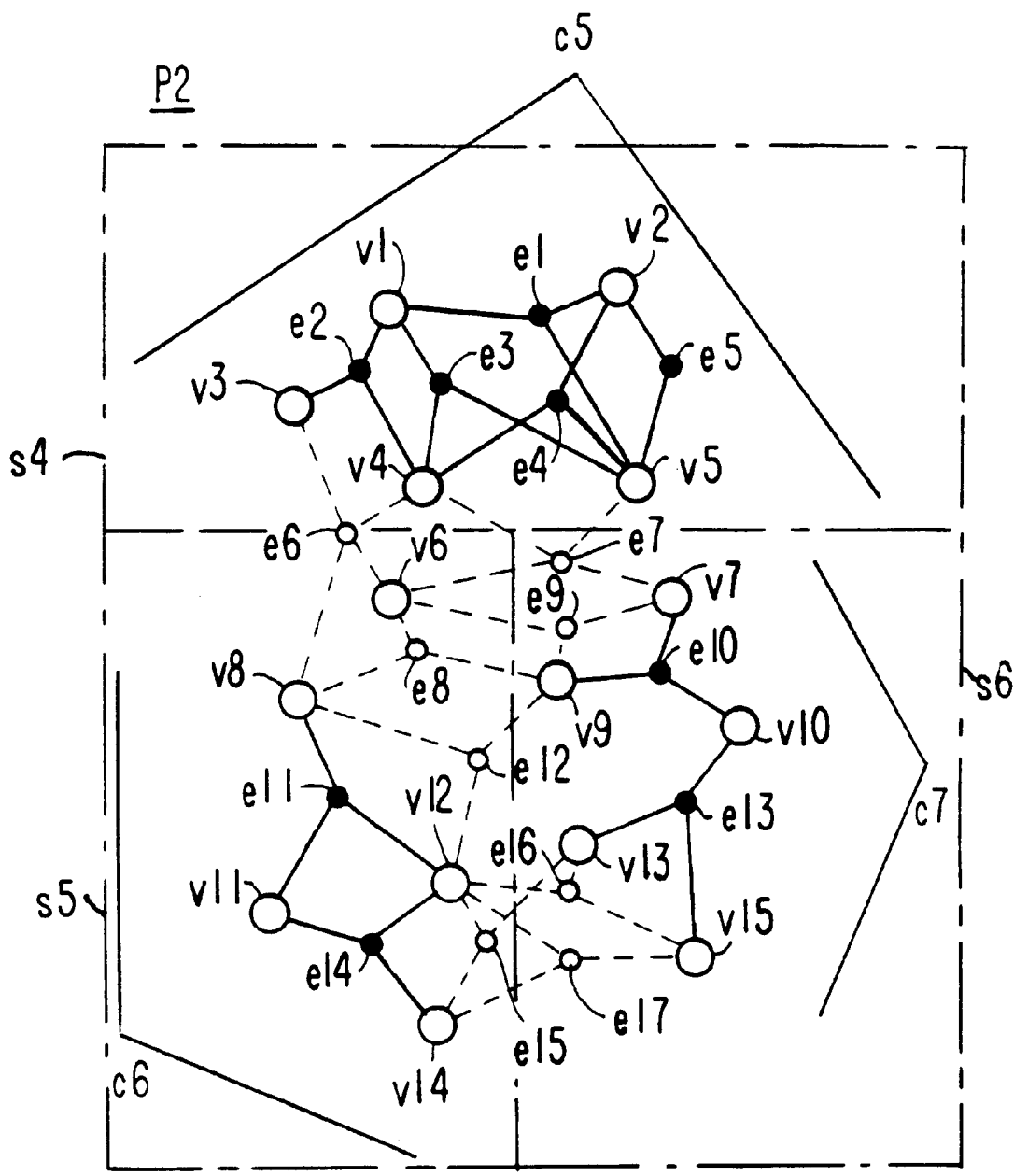

It will be noted that final partition P6 (FIG. 8) is significantly better than either of starting partitions P1 (FIG. 3) and P2 (FIG. 4). Whereas partition P1 has nine global connection edges e1, e3, e4, e7, e8, e9, e11, e12, and e13, and partition P2 has eight global connection edges e6, e7, e8, e9, e12, e15, e16, and e17, P6 has only five global connection edges e6, e7, e11, e12, and e13 (a 44% reduction as compared to P1 and a 37% reduction as compared to P2).

It will be understood that the foregoing is only illustrative of the principles of the invention, and that various modifications can be made by those skilled in the art without departing from the scope and spirit of the invention. For example, the hypergraph model of a circuit design to be partitioned is only one way to represent data for a circuit design. Design circuit data can be manipulated in accordance with the methods of this invention without constructing any hypergraphs of the type shown herein. Hypergraph models have been shown herein only because they are a convenient way to depict for the reader of this specification the design circuit data and its manipulation in accordance with this invention.

The invention claimed is:

1. A method of implementing a circuit design in a physical circuit which includes a plurality of physical subcircuits, said circuit design including a plurality of circuit elements and a plurality of connections between said elements, said method comprising:

partitioning said circuit design into a first plurality of design subcircuits;

partitioning said circuit design into a second plurality of design subcircuits, said design subcircuits in said first plurality being different from said design subcircuits in said second plurality; and selectively combining features from said first and second pluralities of design subcircuits to produce a third plurality of design subcircuits.

2. The method of claim 1 wherein said third plurality of design subcircuits requires fewer of said connections to extend between said design subcircuits in said third plurality than are required to extend between said design subcircuits in either of said first plurality or said second plurality.

3. The method of claim 2 wherein each of said partitionings is performed according to conventional partitioning techniques.

4. The method of claim 3 wherein said first and second pluralities of design subcircuits are each the best of several trials with regard to reducing numbers of said connections that are required to extend between the design subcircuits in the respective first and second pluralities.

5. The method of claim 4 wherein said selectively combining includes coupling selected elements from said first and second pluralities of design subcircuits.

6. A method of implementing a circuit design in a physical circuit which includes a plurality of physical subcircuits, said circuit design including a plurality of circuit elements and a plurality of connections between said elements, said method comprising:

representing said circuit design as a plurality of vertices joined by edges;

partitioning said vertices and edges into a first plurality of design subcircuits;

partitioning said vertices and edges into a second plurality of design subcircuits, said design subcircuits in said first plurality being different from said design subcircuits in said second plurality; and selectively combining features from said first and second pluralities of design subcircuits to produce a third plurality of design subcircuits which is better than either.

7. The method of claim 6 wherein said third plurality of design subcircuits requires fewer of said connections to extend between said design subcircuits in said third plurality than are required to extend between said design subcircuits in either of said first plurality or said second plurality.

8. The method of claim 7 wherein each of said partitioning is performed according to conventional partitioning techniques.

9. The method of claim 8 wherein each of said first and second pluralities of design subcircuits are the best of several trials with regard to reducing numbers of said connections that are required to extend between the design subcircuits in the respective first and second pluralities.

10. The method of claim 9 wherein said selectively combining includes coupling selected elements from said first and second pluralities of design subcircuits.

* * * * *